US010930821B2

(12) United States Patent
Furuyama

(10) Patent No.: US 10,930,821 B2
(45) Date of Patent: Feb. 23, 2021

(54) WAVELENGTH CONVERSION MEMBER AND LIGHT EMITTING DEVICE

(71) Applicant: NIPPON ELECTRIC GLASS CO., LTD., Otsu (JP)

(72) Inventor: Tadahito Furuyama, Otsu (JP)

(73) Assignee: NIPPON ELECTRIC GLASS CO., LTD., Shiga (JP)

( * ) Notice: Subject to any disclaimer, the term of this patent is extended or adjusted under 35 U.S.C. 154(b) by 0 days.

(21) Appl. No.: 16/609,792

(22) PCT Filed: May 29, 2018

(86) PCT No.: PCT/JP2018/020590
§ 371 (c)(1),
(2) Date: Oct. 31, 2019

(87) PCT Pub. No.: WO2018/230333
PCT Pub. Date: Dec. 20, 2018

(65) Prior Publication Data
US 2020/0058830 A1 Feb. 20, 2020

(30) Foreign Application Priority Data

Jun. 14, 2017 (JP) .............................. JP2017-116477

(51) Int. Cl.
*H01L 33/50* (2010.01)
*F21V 29/502* (2015.01)
*G02B 5/26* (2006.01)
*G02B 26/00* (2006.01)
*G03B 21/16* (2006.01)

(52) U.S. Cl.
CPC .......... *H01L 33/501* (2013.01); *F21V 29/502* (2015.01); *G02B 5/26* (2013.01); *G02B 26/008* (2013.01); *G03B 21/16* (2013.01)

(58) Field of Classification Search
None
See application file for complete search history.

(56) References Cited

U.S. PATENT DOCUMENTS

2016/0238922 A1  8/2016  Furuyama et al.
2016/0252722 A1  9/2016  Li et al.
2016/0377967 A1  12/2016  Ando et al.
(Continued)

FOREIGN PATENT DOCUMENTS

JP  2004-341105 A  12/2004
JP  2012-015001 A  1/2012
(Continued)

OTHER PUBLICATIONS

Official Communication issued in International Patent Application No. PCT/JP2018/020590, dated Aug. 21, 2018.

*Primary Examiner* — Britt D Hanley
(74) *Attorney, Agent, or Firm* — Keating and Bennett, LLP

(57) ABSTRACT

Provided is a wavelength conversion member capable of suppressing excessive heating of a phosphor layer and a light emitting device using the same. The wavelength conversion member 10 includes: a heat dissipation substrate 11; a phosphor layer 12 provided on the heat dissipation substrate 11; and a bonding material layer 13 provided between the heat dissipation substrate 11 and the phosphor layer 12, wherein the bonding material layer 13 includes a thermally conductive porous body 14 and a bonding material 15 and the thermally conductive porous body 14 is impregnated with the bonding material 15.

14 Claims, 2 Drawing Sheets

(56) References Cited

U.S. PATENT DOCUMENTS

2018/0003363 A1  1/2018  Furuyama
2019/0294032 A1  9/2019  Hirano et al.

FOREIGN PATENT DOCUMENTS

| JP | 2015-094777 A | 5/2015 |
| JP | 2015-118107 A | 6/2015 |
| JP | 2015-121586 A | 7/2015 |
| JP | 2015-143824 A | 8/2015 |
| JP | 2015-215583 A | 12/2015 |
| JP | 2016-535396 A | 11/2016 |
| WO | 2016/125611 A1 | 8/2016 |
| WO | 2018/042825 A1 | 3/2018 |

[FIG. 1]
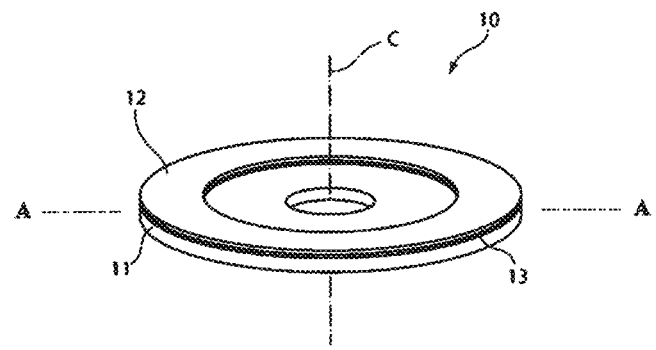
[FIG. 2]
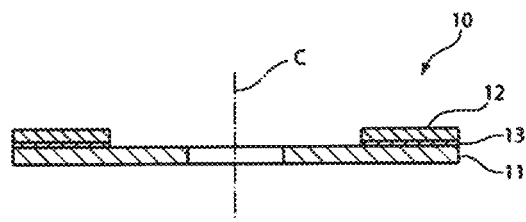
[FIG. 3]
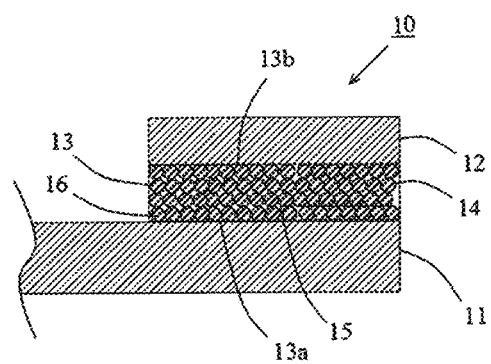

[FIG. 4]
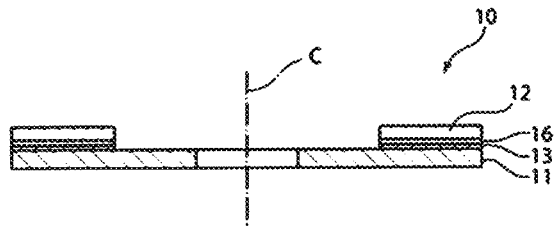
[FIG. 5]
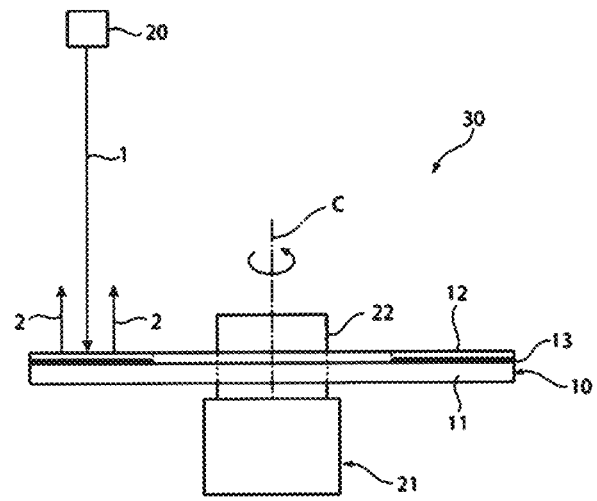
[FIG. 6]
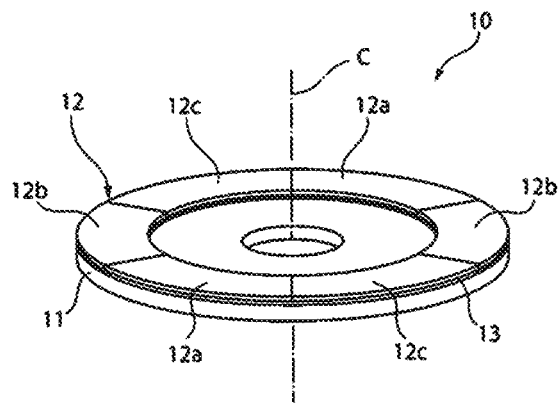

WAVELENGTH CONVERSION MEMBER AND LIGHT EMITTING DEVICE

TECHNICAL FIELD

The present invention relates to wavelength conversion members, such as fluorescent wheels for projectors, and light emitting devices using the same.

BACKGROUND ART

To reduce the size of lightings, such as projectors, there have recently been proposed light emitting devices in which an LED (light emitting diode) and a phosphor are used. For example, Patent Literature 1 discloses a projector using a light emitting device including: a light source capable of emitting ultraviolet light; and a phosphor layer that converts the ultraviolet light from the light source into visible light. In Patent Literature 1, a fluorescent wheel is used which has been produced by providing an annular phosphor layer on an annular rotatable transparent substrate.

CITATION LIST

Patent Literature

[PTL 1]
JP-A-2004-341105

SUMMARY OF INVENTION

Technical Problem

With the use of a high-power light source, the amount of heat produced by the phosphor upon application of excitation light is large, so that the phosphor layer is excessively heated. Excessive heating of the phosphor layer may cause a problem of significantly decreased fluorescence intensity or a problem of peeling of the phosphor layer from the substrate depending on the situation.

An object of the present invention is to provide a wavelength conversion member capable of suppressing excessive heating of a phosphor layer and a light emitting device using the same.

Solution to Problem

A wavelength conversion member according to the present invention includes: a heat dissipation substrate; a phosphor layer provided on the heat dissipation substrate; and a bonding material layer provided between the heat dissipation substrate and the phosphor layer, wherein the bonding material layer comprises a thermally conductive porous body and a bonding material and the thermally conductive porous body is impregnated with the bonding material. With this structure, a three-dimensional heat-conducting path is formed in the bonding material layer by the thermally conductive porous body, so that heat produced in the phosphor layer is efficiently conducted to the heat dissipation substrate and is in turn released from the heat dissipation substrate to the outside. Therefore, excessive heating of the phosphor layer can be suppressed. Hence, problems of significantly decreased fluorescence intensity, peeling of the phosphor layer from the substrate, and so on, which may be caused by excessive heating of the phosphor layer, can be prevented. Pores (air) present inside the thermally conductive porous body may cause a decrease in thermal conductivity. Since in the wavelength conversion member according to the present invention the thermally conductive porous body is impregnated with the bonding material, pores present inside the thermally conductive porous body can be reduced as much as possible, which increases the thermal conductivity. Furthermore, since the thermally conductive porous body is impregnated with the bonding material, the bonding force can be increased as compared to the case where it is impregnated with no bonding material.

In the wavelength conversion member according to the present invention, a percentage by volume of the thermally conductive porous body in the bonding material layer is preferably 20 to 90%. By doing so, heat produced in the phosphor layer can be efficiently conducted to the heat dissipation substrate while the bondability between the heat dissipation substrate and the phosphor layer can be maintained.

In the wavelength conversion member according to the present invention, the thermally conductive porous body is preferably formed of a sintered body of inorganic particles.

In the wavelength conversion member according to the present invention, the inorganic particles are preferably ceramic particles of at least one selected from among boron nitride, aluminum nitride, aluminum oxide, magnesium oxide, titanium oxide, niobium oxide, zirconium oxide, zinc oxide, and silicon oxide; glass particles; or metal particles of at least one selected from aluminum and silver.

In the wavelength conversion member according to the present invention, the bonding material is preferably a silicone resin, an epoxy resin or an acrylic resin.

In the wavelength conversion member according to the present invention, the phosphor layer preferably contains a glass matrix and a phosphor dispersed in the glass matrix.

In the wavelength conversion member according to the present invention, the heat dissipation substrate is preferably a metallic substrate.

In the wavelength conversion member according to the present invention, the metallic substrate is preferably an aluminum alloy substrate.

In the wavelength conversion member according to the present invention, a reflective film may be provided on a surface of the phosphor layer facing the heat dissipation substrate.

In the wavelength conversion member according to the present invention, the reflective film is preferably a metallic reflective film or a dielectric multi-layer film.

In the wavelength conversion member according to the present invention, the heat dissipation substrate and/or the phosphor layer is preferably in contact with the thermally conductive porous body. By doing so, heat produced in the phosphor layer is more likely to be efficiently conducted through the thermally conductive porous body to the heat dissipation substrate.

In the wavelength conversion member according to the present invention, the heat dissipation substrate preferably has an annular shape.

The wavelength conversion member according to the present invention is suitable for a projector.

A light emitting device according to the present invention comprises: the above-described wavelength conversion member; and a light source capable of irradiating the phosphor layer of the wavelength conversion member with excitation light.

Advantageous Effects of Invention

The present invention enables provision of a wavelength conversion member capable of suppressing excessive heating of a phosphor layer and a light emitting device using the same.

BRIEF DESCRIPTION OF DRAWINGS

FIG. 1 is a perspective view showing a fluorescent wheel for a projector according to a first embodiment of the present invention.

FIG. 2 is a cross-sectional view taken along the line A-A shown in FIG. 1.

FIG. 3 is a partial cross-sectional view showing on an enlarged scale the vicinity of a phosphor layer in the fluorescent wheel for a projector according to the first embodiment of the present invention.

FIG. 4 is a cross-sectional view showing a fluorescent wheel for a projector according to a second embodiment of the present invention.

FIG. 5 is a side view showing a fluorescence device for a projector in which the light-emitting wheel for a projector according to the first embodiment of the present invention is used.

FIG. 6 is a perspective view showing a fluorescent wheel for a projector according to a third embodiment of the present invention.

DESCRIPTION OF EMBODIMENTS

Hereinafter, a description will be given of preferred embodiments. However, the following embodiments are simply illustrative and the present invention is not intended to be limited to the following embodiments. In the drawings, elements having substantially the same functions may be referred to by the same reference signs.

FIG. 1 is a perspective view showing a fluorescent wheel for a projector according to a wavelength conversion member as a first embodiment of the present invention. FIG. 2 is a (vertical) cross-sectional view taken along the line A-A shown in FIG. 1. As shown in FIGS. 1 and 2, a fluorescent wheel (a wavelength conversion member) 10 has an annular shape. The fluorescent wheel 10 includes: an annular heat dissipation substrate 11; an annular phosphor layer 12 provided on the heat dissipation substrate 11; and a bonding material layer 13 provided between the heat dissipation substrate 11 and the phosphor layer 12 and bonding the heat dissipation substrate 11 and the phosphor layer 12 together.

FIG. 3 is a partial cross-sectional view showing on an enlarged scale the vicinity of the phosphor layer 12 in the fluorescent wheel 10 shown in FIG. 2. The bonding material layer 13 includes a thermally conductive porous body 14 and a bonding material 15 with which the thermally conductive porous body 14 is impregnated. In this embodiment, the thermally conductive porous body 14 is formed of a sintered body of inorganic particles 16.

The thermally conductive porous body 14 is preferably in contact, at a principal surface 13a of the bonding material layer 13, with the heat dissipation substrate 11, while the thermally conductive porous body 14 is preferably in contact, at a principal surface 13b of the bonding material layer 13, with the phosphor layer 12. By doing so, heat produced in the phosphor layer 12 is more likely to be conducted through the thermally conductive porous body 14 to the heat dissipation substrate 11 side. However, the thermally conductive porous body 14 may not necessarily be in contact, at both the principal surfaces 13a and 13b of the bonding material layer 13, with the heat dissipation substrate 11 and the phosphor layer 12, respectively. For example, the thermally conductive porous body 14 may be in contact, only at either one of the principal surfaces 13a and 13b of the bonding material layer 13, with the heat dissipation substrate 11 or the phosphor layer 12 or may be in contact, at neither of the principal surfaces 13a and 13b of the bonding material layer 13, with neither the heat dissipation substrate 11 nor the phosphor layer 12. Note that even when the thermally conductive porous body 14 is in contact with the heat dissipation substrate 11 or the phosphor layer 12, the bonding material 15 is partially externally exposed at the principal surfaces 13a and 13b of the bonding material layer 13 and is therefore in contact with both the heat dissipation substrate 11 and the phosphor layer 12. Thus, the bondability between the heat dissipation substrate 11 and the phosphor layer 12 is ensured.

The thermally conductive porous body 14 can be formed to function as a reflective layer by appropriately selecting the material for the constituent inorganic particles 16. The reflective layer in this case utilizes diffuse reflection from the inorganic particles 16. When a substrate having a light-reflecting function, such as a metallic substrate as will be described hereinafter, is used as the heat dissipation substrate 11, a combination of diffuse reflection from the inorganic particles 16 and reflection from the heat dissipation substrate 11 can provide good reflective properties.

The following is a detailed description of the components on a component-by-component basis.

Examples of the heat dissipation substrate 11 include a metallic substrate, a carbon substrate, a ceramic substrate, and a substrate made of a ceramic-metal composite. In this embodiment, a metallic substrate is used as the heat dissipation substrate 11 and takes not only a role of heat dissipation but also a role of light reflection. Specifically, the metallic substrate reflects excitation light having entered the phosphor layer 12 and fluorescence emitted from the phosphor upon entry of the excitation light. The metallic substrate is made of metal or alloy and may undergo surface treatment. The metallic substrate preferably has a high reflectance and an example thereof is an aluminum substrate having a surface on which a reflectivity enhancing film made of a metal oxide or other materials is formed. Examples of such a metallic substrate include Miro (registered trademark) and Miro-Silver (registered trademark) both manufactured by Alanod.

The phosphor layer 12 is composed of, a glass matrix and a phosphor dispersed in the glass matrix. In this embodiment, particles of an inorganic phosphor are used as the phosphor.

No particular limitation is placed on the type of the glass matrix so long as it can be used as a dispersion medium for the phosphor. Examples that can be used include borosilicate-based glasses and phosphate-based glasses. The softening point of the glass matrix is preferably 250 to 1000° C. and more preferably 300 to 850° C. If the softening point of the glass matrix is too low, the mechanical strength and chemical durability of the phosphor layer 12 may decrease. Furthermore, because the thermal resistance of the glass matrix itself becomes low, the glass matrix may be softened and deformed by heat produced from the phosphor. On the other hand, if the softening point of the glass matrix is too high, the phosphor may degrade in the firing step during production, so that the luminescence intensity of the phosphor layer 12 may decrease.

No particular limitation is placed on the type of the phosphor so long as it can emit fluorescence upon entry of excitation light. Specific examples of the phosphor are one or more selected from among, for example, oxide phosphor, nitride phosphor, oxynitride phosphor, chloride phosphor, oxychloride phosphor, sulfide phosphor, oxysulfide phosphor, halide phosphor, chalcogenide phosphor, aluminate phosphor, halophosphoric acid chloride phosphor, and garnet-based compound phosphor. With the use of blue light as excitation light, a phosphor capable of emitting as fluorescence, for example, green light or yellow light can be used.

The average particle diameter of the phosphor is preferably 1 to 50 μm and more preferably 5 to 25 μm. If the average particle diameter of the phosphor is too small, the luminescence intensity may decrease. On the other hand, if the average particle diameter of the phosphor is too large, the luminescent color may be uneven.

The content of phosphor in the phosphor layer 12 is preferably in a range of 5 to 80% by volume, more preferably in a range of 10 to 75% by volume, and still more preferably in a range of 20 to 70% by volume. If the content of phosphor is too small, fluorescence having a desired luminescence intensity is less likely to be achieved. On the other hand, if the content of phosphor is too large, the mechanical strength of the phosphor layer 12 is likely to decrease.

The thickness of the phosphor layer 12 is preferably small to the extent that excitation light can be surely absorbed into the phosphor. The reason for this is that if the phosphor layer 12 is too thick, scattering and absorption of light in the phosphor layer 12 may be too much, so that the efficiency of emission of fluorescence may be low. Specifically, the thickness of the phosphor layer 12 is preferably 1 mm or less, more preferably 0.5 mm or less, and still more preferably 0.3 mm or less. The lower limit of the thickness of the phosphor layer 12 is generally about 0.03 mm.

As the phosphor layer 12, a phosphor layer containing, aside from the above phosphors, a ceramic phosphor can also be used.

The thermally conductive porous body 14 is made of a material having a higher thermal conductivity than the phosphor layer 12 (particularly, the glass matrix constituting part of the phosphor layer 12). Specific examples of the inorganic particles 16 forming the thermally conductive porous body 14 include: sintered bodies of various ceramic particles, such as boron nitride, aluminum nitride, aluminum oxide, magnesium oxide, titanium oxide, niobium oxide, zirconium oxide, zinc oxide, and silicon oxide; sintered bodies of various glass particles, such as oxide glasses; and sintered bodies of various metal particles, such as aluminum and silver. Preferred among them are aluminum oxide and magnesium oxide because of their excellent thermal conductivity and sinterability. Alternatively, in allowing the thermally conductive porous body 14 to function as a reflective layer, aluminum oxide and titanium oxide have the advantage of having excellent reflective properties. In satisfying both the thermal conductivity and the reflective properties, aluminum oxide or magnesium oxide having excellent thermal conductivity may be mixed with titanium oxide having excellent reflective properties.

The average particle diameter ($D_{50}$) of the inorganic particles 16 is preferably in a range of 0.01 to 50 μm and more preferably in a range of 0.05 to 10 μm. If the average particle diameter of the inorganic particles 16 is too small, the pore diameter is small, which makes it difficult to impregnate the thermally conductive porous body 14 with the bonding material 15. On the other hand, if the average particle diameter of the inorganic particles 16 is too large, the sinterability becomes insufficient, so that the mechanical strength of the thermally conductive porous body 14 is likely to decrease.

The percentage by volume of the thermally conductive porous body 14 in the bonding material layer 13 is preferably in a range of 20 to 90%, more preferably in a range of 30 to 80%, and still more preferably in a range of 40 to 70%. If the percentage by volume of the thermally conductive porous body 14 is too small, the heat-conducting path in the bonding material layer 13 cannot sufficiently be secured, so that heat produced in the phosphor layer 12 is less likely to be sufficiently conducted to the heat dissipation substrate 11. On the other hand, if the percentage by volume of the thermally conductive porous body 14 is too large, the percentage of the bonding material 15 in the bonding material layer 13 becomes small, so that the bonding force between the heat dissipation substrate 11 and the phosphor layer 12 may decrease. The term "percentage by volume of the thermally conductive porous body" herein means a percentage by volume of the bonding material layer accounted for by a material (for example, inorganic particles) forming the thermally conductive porous body, but does not include the percentage by volume of pores and bonding material present inside the thermally conductive porous body.

The porosity of the thermally conductive porous body 14 is preferably in a range of 10 to 80%, more preferably in a range of 20 to 70%, and still more preferably in a range of 30 to 60%. If the porosity of the thermally conductive porous body 14 is too small, the percentage of the bonding material 15 in the bonding material layer 13 becomes small, so that the bonding force between the heat dissipation substrate 11 and the phosphor layer 12 may decrease. On the other hand, if the porosity of the thermally conductive porous body 14 is too large, the heat-conducting path in the bonding material layer 13 cannot sufficiently be secured, so that heat produced in the phosphor layer 12 is less likely to be sufficiently conducted to the heat dissipation substrate 11.

The bonding material 15 is preferably transparent. Thus, the bonding material 15 can efficiently transmit fluorescence and excitation light, which enables the luminous efficiency to be improved. Specific examples of such a transparent bonding material 15 include silicone resin, acrylic resin, and epoxy resin. However, the bonding material 15 is not limited to be transparent but non-transparent bonding materials can also be used.

Commercially available acrylic resins and epoxy resins can be used as the acrylic resin and the epoxy resin. If the purpose is to reduce the difference in thermal expansion between the heat dissipation substrate 11 and the phosphor layer 12 during curing, it is preferable to use a two-component cold-setting resin. The viscosity is, for ease of impregnation of the thermally conductive porous body 14, preferably 1500 cP or less, more preferably 1000 cP or less, and particularly preferably 500 cP or less. Silicone resins that can be used are those having a general siloxane bond and among them silsesquioxanes having high thermal resistance can be particularly preferably used. Silsesquioxanes are siloxane-based compounds having a main chain skeleton formed of a Si—O—Si bond and are network polymers or polyhedral clusters having a $(RSiO_{1.5})_n$ structure obtained by hydrolyzing trifunctional silane.

The thickness of the bonding material layer 13 is preferably 20 to 500 μm and more preferably 50 to 300 μm. If the thickness of the bonding material layer 13 is too small, the bonding strength between the heat dissipation substrate 11 and the phosphor layer 12 may be poor. On the other hand, if the thickness of the bonding material layer 13 is too large, heat produced in the phosphor layer 12 may be less likely to be released to the heat dissipation substrate 11.

FIG. 4 is a cross-sectional view showing a fluorescent wheel for a projector according to a second embodiment of the present invention. In this embodiment, a reflective film 16 is provided on a surface of the phosphor layer 12 facing the heat dissipation substrate 11 (i.e., between the phosphor layer 12 and the bonding material layer 13).

Examples of the reflective film 16 include a reflective metal film made of silver, aluminum, platinum or so on and a dielectric multi-layer film. The dielectric multi-layer film is a film formed of a laminate of high-refractive index films and low-refractive index films and can selectively reflect light having a particular wavelength. Examples of the dielectric multi-layer film include films in which high-refractive index films made of niobium oxide, titanium oxide, lanthanum oxide, tantalum oxide, yttrium oxide, gadolinium oxide, tungsten oxide, hafnium oxide, aluminum oxide, silicon nitride or so on and low-refractive index films made of silicon oxide or so on are alternately laid.

Examples of a method for forming the reflective film 16 include plating or physical vapor deposition methods such as vacuum deposition, ion plating, and sputtering.

The thickness of the reflective film 16 is preferably 0.01 to 100 μm and more preferably 0.03 to 10 μm. If the thickness of the reflective film 16 is too small, sufficient reflective properties may not be achieved. On the other hand, if the thickness of the reflective film 16 is too large, the difference in coefficient of thermal expansion between the reflective film 16 and the phosphor layer 12 may cause breakage of the reflective film 16.

A transparent material layer (not shown) may be provided between the phosphor layer 12 and the reflective film 16. The provision of the transparent material layer enables the principal surface 12b of the phosphor layer 12 to be smoothed to increase the smoothness of the reflective film 16. Thus, the reflective properties of the reflective film 16 can be increased. Examples of the transparent material layer include a glass layer and a resin layer.

The thickness of the transparent material layer is preferably 1 to 100 μm and more preferably 10 to 50 μm. If the thickness of the transparent material layer is too small, this makes it difficult to smooth the principal surface 12b of the phosphor layer 12, so that the reflective film 16 is less likely to be smooth. On the other hand, if the thickness of the transparent material layer is too large, light may propagate through the transparent material layer and leak from an end of the transparent material layer, resulting in decreased luminescence intensity.

In this embodiment, the reflective film 16 takes a role in reflecting excitation light and fluorescence. Therefore, the heat dissipation substrate 11 does not necessarily have light-reflecting properties. Furthermore, the thermally conductive porous body 14 and the bonding material 15 are not necessarily required to be transparent.

The following description is an example of a method for producing a fluorescent wheel 10.

First, a phosphor layer 12 is produced, for example, in the following manner. A slurry containing glass particles forming a glass matrix, a phosphor, and organic components, such as a binder resin and a solvent, is applied onto a resin film made of polyethylene terephthalate or other materials by the doctor blade method or other methods and dried by the application of heat to produce a green sheet for forming a phosphor layer 12. The green sheet is fired at a temperature near the softening point of the glass particles (for example, the softening point ±100° C.), thus obtaining a phosphor layer 12.

Next, a thermally conductive porous body 14 is produced in the following manner. A slurry containing fumed titania (Aeroxide by Evonic) and alumina oxide as ceramic particles and organic components, such as a binder resin and a solvent, is applied onto a resin film made of polyethylene terephthalate or other materials by the doctor blade method or other methods and dried by the application of heat to produce a green sheet for forming a thermally conductive porous body 14. The green sheet is fired (for example, at 1000 to 1500° C.), thus obtaining a thermally conductive porous body 14.

Next, the thermally conductive porous body 14 is immersed into a liquid bonding material 15 filled in a container, thus obtaining a member for a bonding material layer formed so that the thermally conductive porous body 14 is impregnated with the bonding material 15. In the member for a bonding material layer, the thermally conductive porous body 14 is impregnated with the bonding material 15 and the surface of the thermally conductive porous body 14 is coated with the bonding material 15. With the member for a bonding material layer sandwiched between the heat dissipation substrate 11 and the phosphor layer 12 obtained in the above manner, the bonding material 15 is cured, so that the heat dissipation substrate 11 and the phosphor layer 12 can be bonded together. In this manner, a fluorescent wheel 10 can be produced in which the heat dissipation substrate 11 and the phosphor layer 12 are bonded together by a bonding material layer 13.

FIG. 5 is a schematic side view showing a light emitting device for a projector in which the light-emitting wheel for a projector according to the first embodiment of the present invention is used. A light emitting device 30 for a projector according to this embodiment includes the fluorescent wheel 10, a light source 20, and a motor 21 for rotating the fluorescent wheel 10. The annular fluorescent wheel 10 is attached to a rotary shaft 22 of the motor 21 rotatably in the circumferential direction with the central axis C of the rotary shaft 22 as the center of rotation.

Excitation light 1 emitted from the light source 20 enters the phosphor layer 12 of the fluorescent wheel 10. The excitation light 1 having entered the phosphor layer 12 excites the phosphor, so that fluorescence 2 is emitted from the phosphor. The fluorescence 2 emitted toward the heat dissipation substrate 11 is reflected on the surface of the heat dissipation substrate 11 and radiated toward the phosphor layer 12. Examples of the light source 20 include an LED light source and a laser light source.

In the case of using as the light source 20 a light source emitting blue light as excitation light, for example, a phosphor excited by blue light to emit yellow light or green light can be used as the phosphor for the phosphor layer 12. As necessary, it is possible to extract, from the light emitted from the phosphor layer 12, only part thereof having a desired wavelength using a filter. An annular filter may be attached to the rotary shaft 22 and rotated in synchronism with the fluorescent wheel 10 to filter the emitted light.

In this embodiment, the fluorescent wheel 10 rotates circumferentially. As described previously, heat conducted from the phosphor to the heat dissipation substrate 11 is released from the heat dissipation substrate 11 to the outside. Since the fluorescent wheel 10 rotates circumferentially, heat release from the heat dissipation substrate 11 to the outside is further accelerated.

In the fluorescent wheel 10 according to the above embodiment, a phosphor of the same type is contained in the whole area of the phosphor layer 12. However, the present invention is not limited to this form. As in an embodiment to be described below, the phosphor layer 12 may be divided into a plurality of regions along the circumferential direction thereof and the plurality of regions may contain different types of phosphors.

FIG. 6 is a perspective view showing a fluorescent wheel for a projector according to a third embodiment of the present invention. A fluorescent wheel 10 shown in FIG. 6 has two sets of regions, each set including a first region 12a, a second region 12b, and a third region 12c. These regions are provided as circumferential sections as shown in FIG. 6. These regions can be provided to correspond to different regions emitting, for example, red light, green light or blue light, respectively, as fluorescence to use the fluorescent wheel 10 as a color wheel. Also in this case, a bonding material layer 13 includes a thermally conductive porous body 14, so that excessive heating of the phosphor layer 12 can be suppressed. Alternatively, any one of the first region 12a, the second region 12b, and the third region 12c may be a region not provided with the phosphor layer 12 (and also the bonding material layer 13).

Although the above description has been given of a fluorescent wheel for a projector as an example of the wavelength conversion member, the wavelength conversion member according to the present invention is not limited to this. For example, the wavelength conversion member may be a wavelength conversion member in which a heat dissipation substrate having a shape other than the annular shape, such as a rectangular or circular shape, is used. Also in this case, the above-described effects of the present invention can be achieved.

EXAMPLES

The present invention will be described below in detail with reference to an example, but the present invention is not limited to the following example.

Example (1) Production of Phosphor Layer

Raw materials for borosilicate glass were melted at 1300° C. and the melt was formed into a film by a roll press machine. The film-like glass was dry ground with a ball mill using 30-mm diameter zirconia balls and then wet ground with a ball mill using 5-mm diameter zirconia balls, thus obtaining glass powder (softening point: 780° C.) having an average particle diameter ($D_{50}$) of 2 μm.

A YAG phosphor and organic components, including a binder resin and a solvent, were added to the obtained glass powder and the mixture was kneaded for 24 hours, thus obtaining a slurry. The slurry was applied onto a PET (polyethylene terephthalate) film by the doctor blade method and dried to produce a green sheet for forming a phosphor layer. The obtained green sheet was cut into an annular shape by a die and the cut piece was fired at 840° C. to obtain a phosphor layer having a thickness of 0.13 mm.

(2) Production of Thermally Conductive Porous Body

Organic components, including a binder resin and a solvent, were added to inorganic particles (MgO having an average particle diameter of 8 μm) and the mixture was kneaded for 24 hours, thus preparing a slurry. The obtained slurry was applied onto a PET film by the doctor blade method and dried to produce a green sheet for forming a thermally conductive porous body. The obtained green sheet was fired at 1300° C. to obtain a thermally conductive porous body having a thickness of 160 μm.

(3) Production of Fluorescent Wheel

The thermally conductive porous body was immersed into a liquid bonding material (epoxy resin) filled in a container, thus obtaining a member for a bonding material layer formed so that the thermally conductive porous body was impregnated with the bonding material 15. In the member for a bonding material layer, the thermally conductive porous body was impregnated with the bonding material and the surface of the thermally conductive porous body was coated with the bonding material. With the member for a bonding material layer sandwiched between a heat dissipation substrate (an aluminum substrate having a thickness of 0.5 mm) and the phosphor layer obtained in the above manner, the bonding material was cured, so that the heat dissipation substrate and the phosphor layer were bonded together. During the above process, excess bonding material having covered the surface of the thermally conductive porous body leached out through the side surface of the thermally conductive porous body upon sandwiching between the heat dissipation substrate and the phosphor layer. As a result, the thermally conductive porous body partially made direct contact with the heat dissipation substrate and the phosphor. In the manner as thus far described, a wavelength conversion member was produced in which the heat dissipation substrate and the phosphor layer were bonded together by the bonding material layer.

Comparative Example 1

As in Example above, a heat dissipation substrate and a phosphor layer were bonded together by a bonding material to produce a wavelength conversion member. The thickness of the bonding material layer was set at 10 μm.

Comparative Example 2

As in Example above, a heat dissipation substrate and a phosphor layer were bonded together by a bonding material to produce a wavelength conversion member. The thickness of the bonding material layer was set at 160 μm.

<Evaluations>

Each of the wavelength conversion members obtained in the above manners was fixed to the rotary shaft of a motor. As an excitation light source, a light source was prepared which can focus light from a laser unit formed of 30 arrayed 1 W-class laser elements to a 1 mm diameter size with a collecting lens. The optical power of this light source was 30 W and the wavelength was 440 nm. The wavelength conversion member was irradiated with excitation light while being rotated at 7000 RPM and the obtained fluorescence was received via an optical fiber by a small spectrometer (USB-4000 manufactured by Ocean Optics Inc.) to obtain luminescence spectra. The fluorescence intensity was determined from the luminescence spectra. The results are shown in Table 1. The fluorescence intensity is expressed as a value relative to the fluorescence intensity in Comparative Example 1 assumed to be 100.

TABLE 1

|  | Comp. Ex. 1 | Comp. Ex. 2 | Example |
|---|---|---|---|
| Thickness of Bonding Material Layer (μm) | 10 | 160 | 160 |
| Thermally Conductive Porous Body | Not provided | Not provided | Provided |
| Fluorescence Intensity | 100 | 93.7 | 104.1 |

As shown in Table 1, it can be seen that the wavelength conversion member of Example had a high fluorescence intensity as compared to the wavelength conversion members of Comparative Examples.

REFERENCE SIGNS LIST

1 . . . excitation light
2 . . . fluorescence
10 . . . fluorescent wheel
11 . . . heat dissipation substrate
12 . . . phosphor layer
12a . . . first region
12b . . . second region
12c . . . third region
13 . . . bonding material layer
14 . . . thermally conductive porous body
15 . . . bonding material
16 . . . reflective film
20 . . . light source
21 . . . motor
22 . . . rotary shaft
30 . . . light emitting device for projector

The invention claimed is:

1. A wavelength conversion member comprising:
a heat dissipation substrate;
a phosphor layer provided on the heat dissipation substrate; and
a bonding material layer provided between the heat dissipation substrate and the phosphor layer,
wherein the bonding material layer comprises a thermally conductive porous body and a bonding material, and the bonding material is present in the thermally conductive porous body.

2. The wavelength conversion member according to claim 1, wherein a percentage by volume of the thermally conductive porous body in the bonding material layer is 20 to 90%.

3. The wavelength conversion member according to claim 1, wherein the thermally conductive porous body is formed of a sintered body of inorganic particles.

4. The wavelength conversion member according to claim 3, wherein the inorganic particles are ceramic particles of at least one selected from among boron nitride, aluminum nitride, aluminum oxide, magnesium oxide, titanium oxide, niobium oxide, zirconium oxide, zinc oxide, and silicon oxide; glass particles; or metal particles of at least one selected from aluminum and silver.

5. The wavelength conversion member according to claim 1, wherein the bonding material is a silicone resin, an epoxy resin or an acrylic resin.

6. The wavelength conversion member according to claim 1, wherein the phosphor layer contains a glass matrix and a phosphor dispersed in the glass matrix.

7. The wavelength conversion member according to claim 1, wherein the heat dissipation substrate is a metallic substrate.

8. The wavelength conversion member according to claim 7, wherein the metallic substrate is an aluminum alloy substrate.

9. The wavelength conversion member according to claim 1, wherein a reflective film is provided on a surface of the phosphor layer facing the heat dissipation substrate.

10. The wavelength conversion member according to claim 9, wherein the reflective film is a metallic reflective film or a dielectric multi-layer film.

11. The wavelength conversion member according to claim 1, wherein the heat dissipation substrate and/or the phosphor layer is in contact with the thermally conductive porous body.

12. The wavelength conversion member according to claim 1, wherein the heat dissipation substrate has an annular shape.

13. The wavelength conversion member according to claim 1, being for use in a projector.

14. A light emitting device comprising:
the wavelength conversion member according to claim 1; and
a light source capable of irradiating the phosphor layer of the wavelength conversion member with excitation light.

* * * * *